(12) United States Patent
Castaldo et al.

(10) Patent No.: US 8,406,068 B2
(45) Date of Patent: Mar. 26, 2013

(54) VOLTAGE SHIFTER FOR HIGH VOLTAGE OPERATIONS

(75) Inventors: Enrico Castaldo, Catania (IT); Gianbattista Lo Giudice, Pedara (IT); Alfredo Signorello, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 323 days.

(21) Appl. No.: 12/884,380

(22) Filed: Sep. 17, 2010

(65) Prior Publication Data

US 2011/0069563 A1    Mar. 24, 2011

(30) Foreign Application Priority Data

Sep. 18, 2009   (EP) .................................... 09425358

(51) Int. Cl.
*G11C 7/00* (2006.01)
(52) U.S. Cl. ................................. 365/189.11
(58) Field of Classification Search .............. 365/189.11
See application file for complete search history.

(56) References Cited

U.S. PATENT DOCUMENTS

| | | | |
|---|---|---|---|
| 6,018,255 A | 1/2000 | Campardo et al. | |
| 6,351,173 B1 | 2/2002 | Ovens et al. | |
| 7,327,163 B2 | 2/2008 | Chauhan et al. | |
| 7,504,862 B2 | 3/2009 | De Sandre et al. | |
| 2005/0237084 A1 | 10/2005 | Chauhan et al. | |
| 2006/0226873 A1 | 10/2006 | De Sandre et al. | |
| 2006/0256626 A1* | 11/2006 | Werner et al. | 365/189.02 |
| 2010/0214851 A1* | 8/2010 | Nirschl | 365/185.23 |

FOREIGN PATENT DOCUMENTS

WO    2007023727 A1    3/2007

* cited by examiner

*Primary Examiner* — Hoai V Ho
*Assistant Examiner* — Pablo Huerta
(74) *Attorney, Agent, or Firm* — Seed IP Law Group PLLC

(57) ABSTRACT

A voltage shifter has a supply line receiving a supply voltage that varies between a first operating value in a first operating condition and a second high operating value, in a second operating condition. A latch stage is connected to an output branch and to a selection circuit, which receives a selection signal that controls switching of the latch stage. The latch stage is coupled to the supply line and to a reference potential line, which receives a reference voltage that can vary between a first reference value, when the supply voltage has the first operating value, and a second reference value, higher than the first reference value, when the supply voltage has the second operating value. An uncoupling stage is arranged between the latch stage and the selection circuit and uncouples them in the second operating condition, when the supply voltage and the reference voltage are at their second, high, value.

21 Claims, 6 Drawing Sheets

VOLTAGE SHIFTER FOR HIGH VOLTAGE OPERATIONS

BACKGROUND

1. Technical Field

The subject of the present disclosure is a voltage shifter for high voltage operations, in particular for nonvolatile storage devices.

2. Description of the Related Art

As is known, storage devices include a memory array formed by rows and columns, in which each row of the array is associated with a wordline connected to a row driver or row buffer, which is part of a row decoder and has the purpose of controlling the voltage level supplied to the respective wordline. In particular, according to the operation that it is desired to execute, each row driver supplies the appropriate voltage for reading the cells connected to the respective wordline; i.e., it enables the paths that, through access transistors (selection transistors and byte switches), supply the cells with suitable writing or programming voltages.

To this end, each row driver includes an output stage forming a voltage shifter that is able to transform information of a digital (on/off) type, generated by a control-logic circuitry, into an analog output voltage, the value of which can vary, in some embodiments, between 3 and 16 V.

The basic structure of a voltage shifter 1 available on the market and that can be used in a row driver is illustrated in FIG. 1. The voltage shifter 1 includes a latch 2, formed by a first latch transistor 3 and by a second latch transistor 4 (both of a PMOS type); an inverter 5; an intermediate biasing stage 11, formed by a first and a second biasing transistor 12, 13 (both of an NMOS type); and an output branch 6, including a first output transistor 7, of a PMOS type, and a second output transistor 8, of an NMOS type.

A supply line 10 supplying a high supply voltage VH (typically, generated by a charge-pump circuit—not illustrated) is connected to the drain terminals of the latch transistors 3, 4 (defining a first and a second input node 16, 17) and to the respective bulk terminals; a selection signal SEL is supplied on an intermediate biasing input 15 and is supplied directly to the first input node 16 and, after being inverted by the inverter 5, to the second input node 17.

The latch transistors 3, 4 have gate terminals connected in a crossed way to the drain terminal of the other latch transistor 4, 3 (second input node 17 and first input node 16). The drain terminal of the second latch transistor 4 is further connected to the output branch 6, which includes a first output transistor 7, of a PMOS type, and a second output transistor 8, of an NMOS type, connected in series between the supply line 10 and a first reference potential line (ground). The output transistors 7 and 8 have gate terminals connected together and to the second input node 17, and define, in the common connection point, an output terminal 9, for example connected to a wordline (not illustrated), supplying an output signal OUT.

The first and second biasing transistors 12, 13 are connected in series respectively to the first and to the second latch transistors 3, 4; they have gate terminals connected together and to a biasing input 14 and source terminals connected respectively to the input and to the output of the inverter 5. The biasing input 14 receives a biasing voltage VP generated by a supply stage (not illustrated) and has approximately a value equal to Vdd+Vth-200 mV (where Vdd is the general supply voltage of the device that englobes the voltage shifter 1, and Vth is the threshold voltage at 10 nA of the MOS transistors 12, 13). The biasing voltage VP, by increasing the overdrive of the transistors 12, 13, enables a proper operation thereof also for supply voltages Vdd close to the threshold of the transistors, improving the switching speed thereof; it moreover minimizes the leakage current thereof, thus reducing absorption by the charge pump (not illustrated) that generates the operating supply voltage VH. For further information on the operation of this stage see the U.S. Pat. No. 7,504,862 filed in the name of De Sandre et al., in particular with reference to FIG. 6 and the corresponding description (transistors M1, M2 and voltage VG).

Consequently, when the selection signal SEL is high, the first latch transistor 3 is on, the second latch transistor 4 is off, and the first output transistor 7 connects the output terminal 9 to the supply line 10. Instead, if the selection signal SEL is low, the latch 2 switches and the second output transistor 8 grounds the output terminal 9.

In this way, when the selection signal SEL is high (at Vdd), the output terminal 9 receives the operating supply voltage VH, which can assume values of up to 15-16 V.

The known voltage shifter 1 is very simple but, in some applications, may present the following disadvantages:

1. it includes only high voltage transistors, which have a considerable bulk (due to the tolerances, to the biasings, etc.) and can have high parasitic capacitances;

2. when the operating supply voltage VH reaches high values (15-16 V), the drain/bulk junctions of the transistors 3, 4, 7 and 8 may undergo breakdown; moreover the gate oxides are subject to voltage drops equal to the entire value of the operating supply voltage VH; this gate stress, in the long run, can generate trapping of charges on the oxide/semiconductor interface and bring about a worsening of the gain and a raising of the threshold voltage of the transistors.

BRIEF SUMMARY

The present disclosure provides a shifter that is able to overcome the disadvantages referred to above.

In accordance with one aspect of the present disclosure, a voltage shifter is provided that includes a latch stage between the supply line and a reference potential line and having a first input and an output; an output branch between the supply line and the reference potential line and coupled to the output of the latch stage; a selection circuit, receiving a selection signal and connected to the input and to the output of the latch stage; a reference input, connected to the reference potential line and configured so as to receive a reference voltage that varies between a first reference value, when the supply voltage has the first operating value, and a second reference value, higher than the first reference value, when the supply voltage has the second operating value; and an uncoupling stage between the input of the latch stage and the selection circuit and having a uncoupling input receiving a uncoupling signal in the second operating condition.

In accordance with another aspect of the present disclosure, a nonvolatile memory is provided that includes a charge pump, a memory array including a plurality of rows, and a plurality of voltage shifters, each connected between the charge pump and a respective row, wherein the voltage shifters include: a latch stage between the supply line and a reference potential line and having a first input and an output; an output branch between the supply line and the reference potential line and coupled to the output of the latch stage; a selection circuit, receiving a selection signal and connected to the input and to the output of the latch stage; a reference input, connected to the reference potential line and configured so as to receive a reference voltage that varies between a first reference value, when the supply voltage has the first operating value, and a second reference value, higher than the first reference value, when the supply voltage has the second operating value; and an uncoupling stage between the input of the latch stage and the selection circuit and having a uncoupling input receiving a uncoupling signal in the second operating condition.

In accordance with another aspect o the present disclosure, a method is provided that includes supplying a first operating value of a supply voltage on a supply line; supplying a first reference value of a reference voltage on a reference potential line; supplying a selection signal to a latch stage between the supply line and the reference potential line; after the step of supplying a selection signal, generating a second reference value of the reference voltage, higher than the first reference value; and after the step of supplying a selection signal, generating a second operating value of the supply voltage, greater in absolute value than the first operating value and the second reference value.

In accordance with still yet a further aspect of the present disclosure, a device is provided that includes a voltage shifter, connected to a supply line supplying a supply voltage that varies between a first operating value in a first operating condition and a second operating value, higher than the first operating value, in a second operating condition, and comprising: a latch stage between the supply line and a reference potential line and having a first input and an output; an output branch between the supply line and the reference potential line and coupled to the output of the latch stage; a selection circuit, receiving a selection signal and connected to the input and to the output of the latch stage; a reference input, connected to the reference potential line and configured so as to receive a reference voltage that varies between a first reference value, when the supply voltage has the first operating value, and a second reference value, higher than the first reference value, when the supply voltage has the second operating value; and an uncoupling stage between the input of the latch stage and the selection circuit and having a uncoupling input receiving a uncoupling signal in the second operating condition.

BRIEF DESCRIPTION OF THE SEVERAL VIEWS OF THE DRAWINGS

For an understanding of the present disclosure a preferred embodiment thereof is now described, purely by way of non-limiting example, with reference to the attached drawings, wherein.

DETAILED DESCRIPTION

Figure 1:
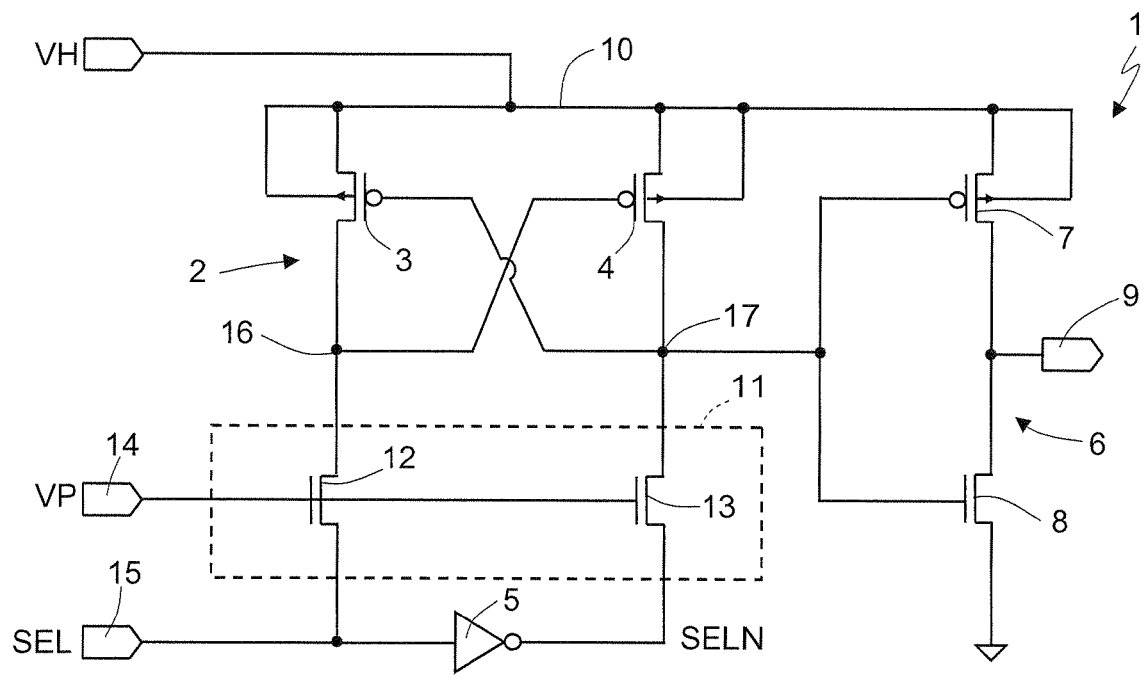
FIG. 1 shows a known voltage shifter.
Figure 2:
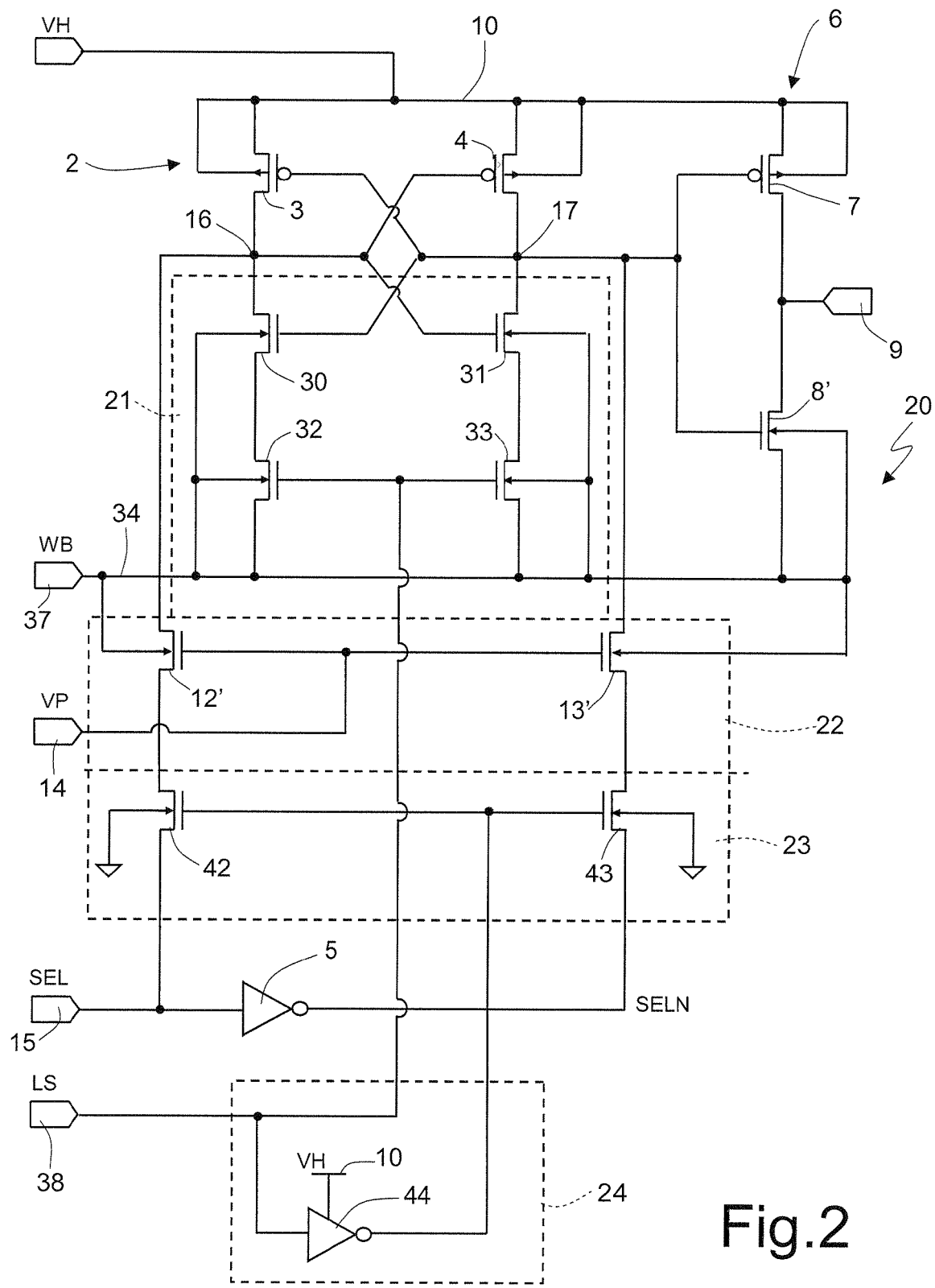
FIG. 2 shows an embodiment of the present voltage shifter.

FIG. 2 shows a voltage shifter 20 including, in addition to the components 2-7 described above with reference to FIG. 1, an auxiliary stage 21; an intermediate biasing stage 22; an uncoupling stage 23; and a mode-switching stage 24. Furthermore, the second output transistor is here replaced by a component (hereinafter referred to as second output transistor 8', for uniformity reasons) in a three-well configuration, as explained in greater detail hereinafter with reference to FIG. 3, and having its bulk and source terminals connected a second reference potential line 34, which is set at a bulk-biasing voltage WB received on a reference input 37 and can be switched between a first reference value (ground potential) and a second reference value (positive voltage, for example 5 V).

In particular, the auxiliary stage 21 includes four NMOS transistors 30-33, all of which in medium-voltage three-well configuration, which include two auxiliary transistors 30 and 31, in series to a respective latch transistor 3, 4, and two switching transistors 32, 33, connected between a respective auxiliary transistor 30, 31 and the second reference potential line 34. All the NMOS transistors 8', 30-33, 12', 13' have their bulk terminal connected to the second reference potential line 34; the auxiliary transistors 30 and 31 have their gate terminal connected to the gate terminal of the respective series-connected latch transistor 3, 4, and the switching transistors 32, 33 have their gate terminals connected together and to a mode-selection input 38, which receives a mode-control signal LS.

The intermediate biasing stage 22 is analogous to the stage 11 of the same name illustrated in FIG. 1 and includes a first and a second biasing transistor 12', 13', both of a medium-voltage NMOS type, in three-well configuration, which have drain terminals connected respectively to the first input node 16 and to the second input node 17; gate terminals connected together and to the biasing input 14; and source terminals connected to the uncoupling stage 23.

The uncoupling stage 23 includes a first and a second uncoupling transistor 42, 43, of an NMOS type, connected in series, respectively, to the first biasing transistor 12' and to the second biasing transistor 13' and having their bulk terminal connected to ground (first reference potential line), their gate terminals connected to one another and to a first output of the mode-switching stage 24, and their source terminals connected respectively to the input and to the output of the selection inverter 5 so as to receive, respectively, the selection signal SEL and the inverted selection signal SELN.

The mode-switching stage 24 includes a mode-control inverter 44, supplied by the supply line 10, having its input connected to the mode-selection input 38 and its output defining the output of the mode-switching stage 24.

Figure 3:
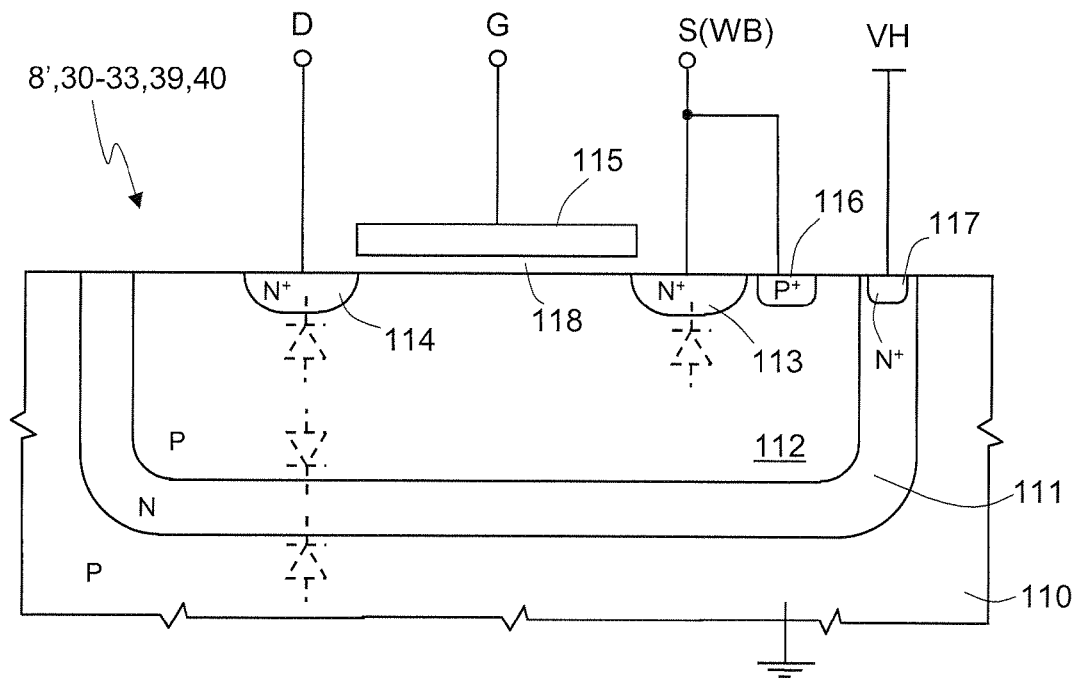
FIG. 3 shows the structure of transistors used in the circuit of FIG. 2.

FIG. 3 shows a possible embodiment of the transistors 8', 30-33, 12', 13' in the three-well configuration. Here, the NMOS transistors are provided in a substrate 110, of a P type, which accommodates an external well 111 of an N type, which in turn accommodates an internal well 112 of a P type that defines the bulk of the transistors 8', 30-33, 12', 13'. The internal well 112 accommodates regions 113 and 114 of an N+ type, which define the source and drain regions of the transistors 8', 30-33, 12', 13', and is electrically connected to the second reference potential line 34. FIG. 3 also shows the gate region 115 of the transistors 8', 30-33, 12', 13', a region 116 of a P+type for contacting the bulk and a region 117 of an N+ type for contacting the external well 111. The external well 111 is biased at the operating supply voltage VH so as to ensure reverse biasing of the junction 111-112. In this way, when the bulk-biasing voltage WB assumes the high value (e.g., 5 V), the bulk well 112 of the transistors 8', 30-33, 12', 13' is biased at the high value, reducing the stress on the gate oxide 118. Furthermore, the junction 110-111 is reverse biased and insulates the transistors 8', 30-33, 12', 13' from the substrate 110.

Instead, the latch transistors 3, 4 and the first output transistor 7 are provided in a simple dedicated well of an N type, biased at VH.

In this way, the transistors 3, 4, 7, 8', 30-33, 12', 13', 42, 43 can be medium-voltage ones, i.e., such as to have a breakdown voltage of at the most 13 V. As is known, MV transistors have the same gate oxide as high voltage transistors, but for a same shape factor, occupy a smaller area since they are designed with different rules that enable a greater layout compactness. In this way, the shifter 20 has an area 10-15% smaller than the known shifter 1 of FIG. 1, notwithstanding the larger number of components.

Operation of the shifter 20 of FIG. 2 will now be described with reference to the time plot of FIGS. 6a and 6b, and using the equivalent circuits of FIGS. 4 and 5, which regard different operation modes and phases.

Operation in Voltage-shifter Mode

This mode is activated during row selection for reading a memory array or, generically, when the operating supply voltage VH assumes a first, relatively low, operating value (for example, 4 V).

In this mode, the bulk-biasing voltage WB is at the first reference value (ground potential, 0 V), the mode-control signal LS is low and the selection signal SEL is at the value envisaged for selecting or deselecting the coupled memory row. In this condition, the auxiliary stage 21 is off (the switching transistors 32 and 33 receive a low signal on their gate terminals); the switching transistors 42, 43 are kept fully on by the signal at output of the mode-control inverter 44, at a high level (equal to the first value of the operating supply voltage VH).

Figure 4:
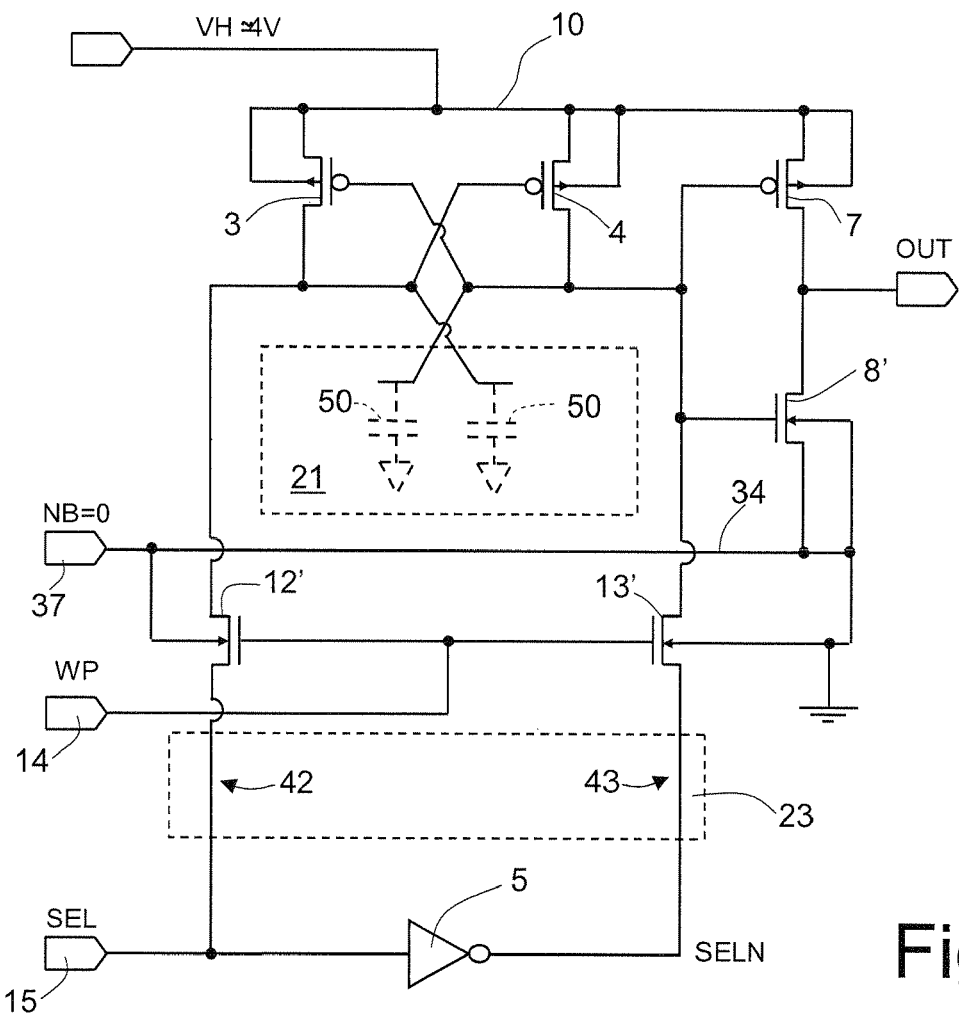
FIGS. 4 and 5 show equivalent circuits of the shifter of FIG. 2, in two different operating conditions.

Consequently, the circuit equivalent to the voltage shifter 20 is illustrated in FIG. 4, where only the equivalent gate capacitance 50 of the auxiliary stage 21 and the switching transistors 42, 43 are represented by closed switches ("on"). In this condition, the voltage shifter 20 is functionally equivalent to the known simple one of FIG. 1 and can be sized to obtain the same dynamic and consumption performances.

Figure 6A:
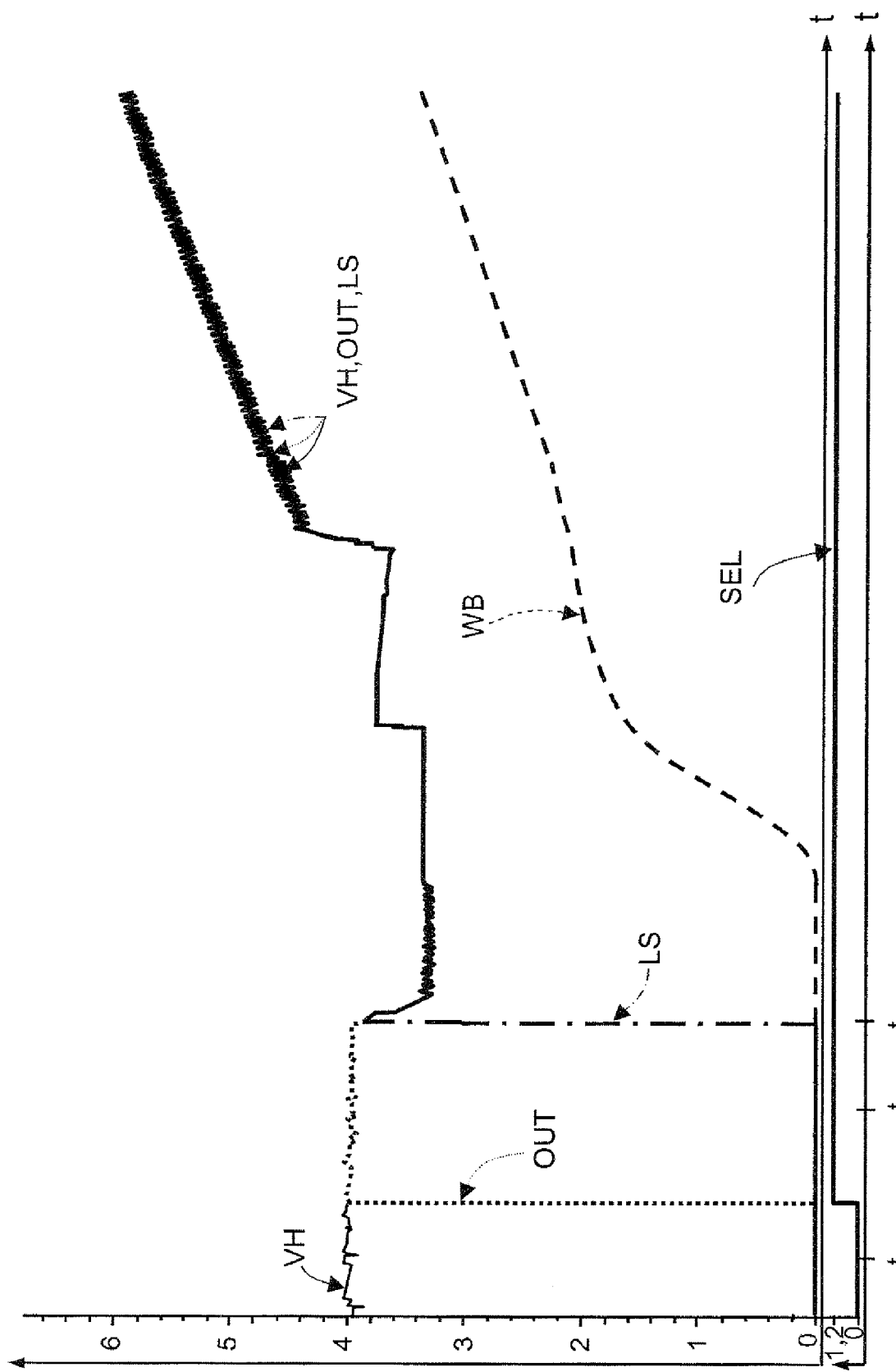
FIGS. 6a and 6b show the plots of quantities of the shifter of FIG. 2 in two different scales.

In practice, the output signal OUT switches between the potential WB, which in this step is at the first reference value (at ground), and the first operating value of the supply voltage VH, as represented at the instant t1 or t2 of FIG. 6a, according to whether the selection signal SEL is respectively low or high.

Operation in Latch Mode

This mode is activated during the row selection for writing or erasing a memory array or, generically, when the operating supply voltage VH assumes a second operating value, decidedly higher than the first operating value (for example, 15-16 V) and the bulk-biasing voltage WB assumes the second reference value, here of a high value, e.g., 5 V.

This mode includes two steps: a first step when the latch switches and the shifter goes into the condition described above for the voltage-shifter mode, and a second step, when the supply voltage starts to increase, up to the second operating value.

In practice, initially the operating supply voltage VH has the first operating value (4 V), the bulk-biasing voltage WB is at the first reference value (0 V), the mode-control signal LS is low, and the selection signal SEL is at the value envisaged for selecting or deselecting the coupled memory row. In this condition, the auxiliary stage 21 is off (the switching transistors 32 and 33 receive a low signal on their gate terminals); the switching transistors 42, 43 are kept fully on by the signal at output of the mode-control inverter 44, at a high level (at VH). Consequently, the output signal OUT has the value represented at the instant t1 or t2 of FIG. 6a, according to the value of the selection signal SEL.

After possible switching of the latch transistors 3, 4 and in any case their storing of the selection/deselection condition of the associated row word, the mode-control signal LS switches from the low state to the high state (instant t3 in FIG. 6a), and the shifter 20 goes into high voltage latch configuration. In particular, the mode-control signal LS rises to VH and switches on the switching transistors 32, 33, which thus in turn enable switching-on of the auxiliary transistors 30, 31, which confirm the state stored in the latch transistors 3, 4. The output of the mode-control inverter 44 (low), instead, switches off the uncoupling transistors 42, 43, which thus uncouple the logic-selection circuitry at low supply voltage (Vdd)—including the components of the inverter 5 and those of the control circuitry upstream, not illustrated—from the high voltages, and in effect cause switching-off of the intermediate biasing transistors 12', 13'.

Figure 5:
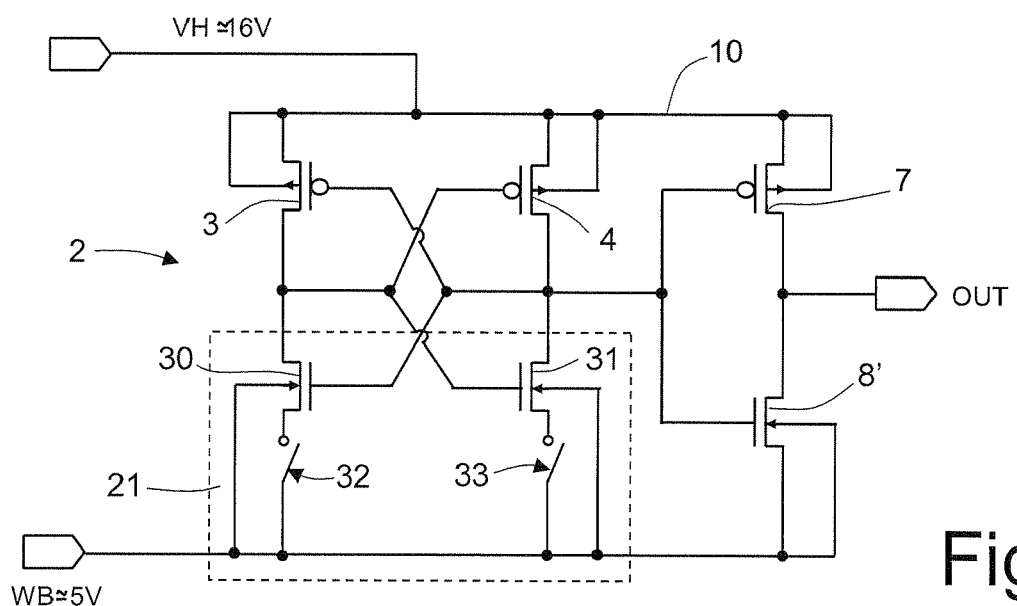

In this step, the shifter 20 thus has the equivalent illustrated in FIG. 5, where the switching transistors 32, 33 are represented by closed switches, the auxiliary transistors 30, 31 form a latch for storing the output state, together with the latch transistors 3, 4. Furthermore, with a certain safety delay with respect to the switching of the mode-control signal LS, the operating supply voltage VH starts to increase and, through a ramp, is brought to the second operating value, e.g., 16 V, and the bulk-biasing voltage WB supplied to the transistors 8', 30-33, 12', 13' starts to increase from the first reference value to the second reference value (0→5 V), as illustrated in FIG. 6a in more enlarged scale and in FIG. 6b, regarding an entire modification step (writing or erasing). In particular, the bulk-biasing voltage WB can increase simultaneously with the operating supply voltage VH, via a limiter that limits the value thereof, as illustrated hereinafter with reference to FIG. 7.

Figure 6B:
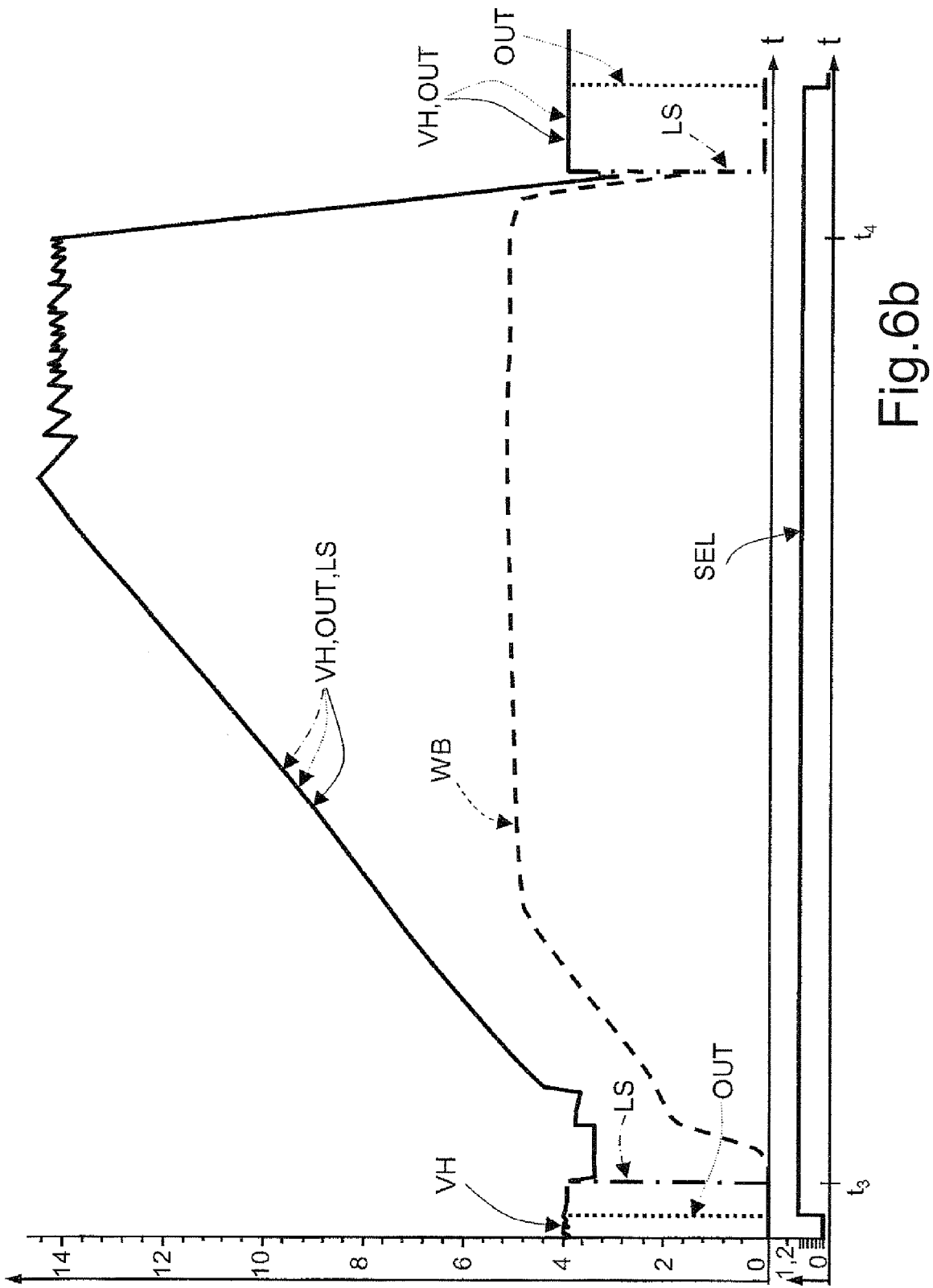

Consequently, in the case of selected output, as illustrated in FIGS. 6a and 6b, the output signal OUT follows the dynamics of the supply voltage VH and reaches the second operating value, where it remains for the whole time necessary for executing the envisaged modification operations. At the end (instant t4 in FIG. 6b), the supply voltage VH starts to drop and, via a rapid falling ramp, returns to the first operating value. Likewise, also the bulk-biasing voltage WB drops, returning to the first reference value. The switching-control signal LS switches to the low state (ground) at the end of the falling ramp of the supply voltage VH; finally, also the selection signal SEL switches.

For the deselected output, the output signal follows, instead, the dynamics of the bulk-biasing voltage WB, reaching the second reference value (approximately 5 V).

Figure 7:
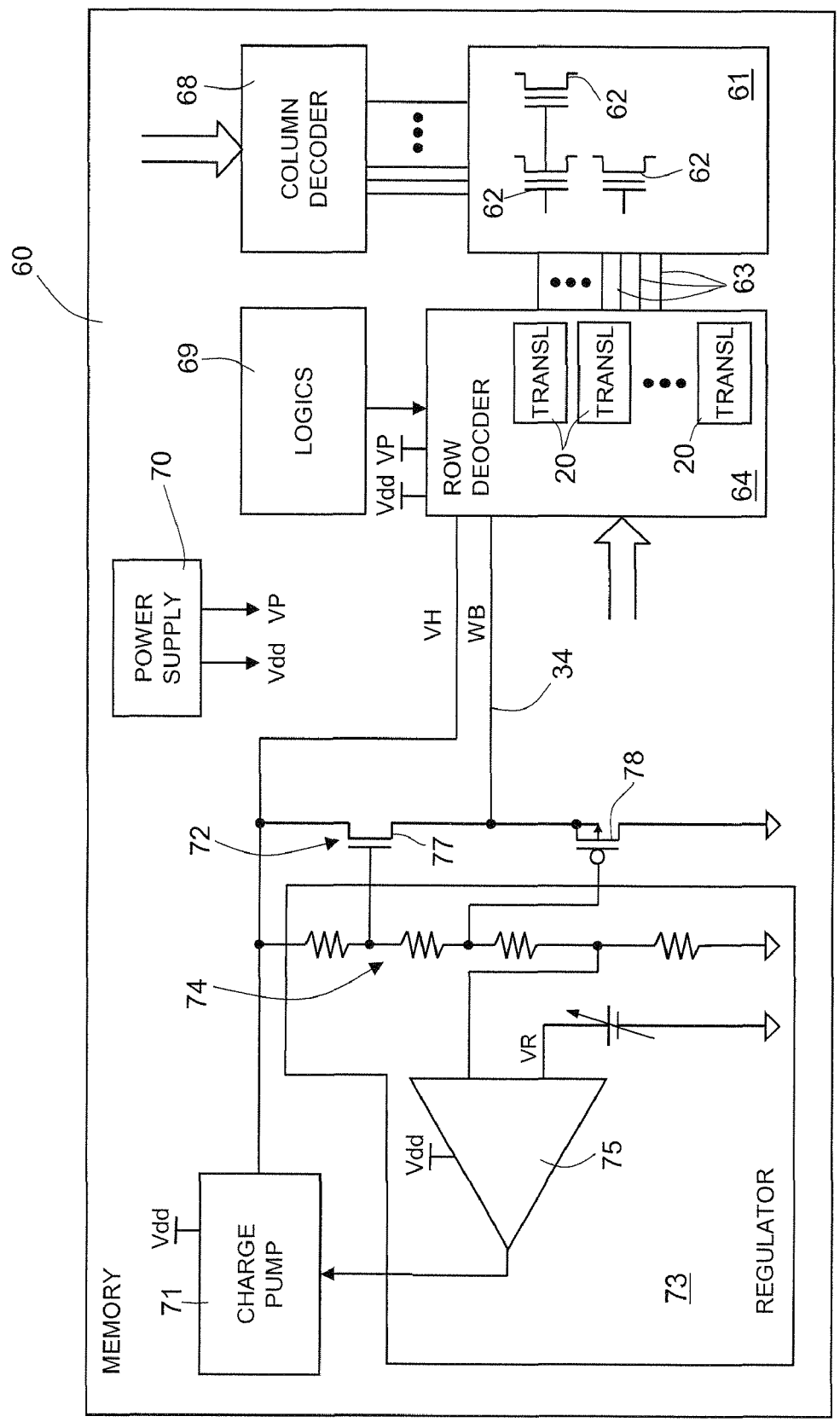
FIG. 7 is a simplified electrical diagram of a nonvolatile memory that uses the present shifter.

FIG. 7 shows a possible use of the voltage shifter 20 in a nonvolatile memory 60 including an array 61 formed by a plurality of memory cells 62, arranged in rows and columns. In particular, the memory cells 62 arranged in a same row are connected to an own wordline 63 connected to a row decoder 64, including, in the final stages, a plurality of voltage shifters 20 of FIG. 2, one for each row. The array 61 is further connected to a column decoder 68, of a known type.

The row decoder 64 is connected to a logic circuit 69 that generates the signals useful for its operation, including the switching-control signals LS, and a supply stage 70 that generates the low voltages, which include the memory supply voltage Vdd and the biasing voltage Vp.

A charge pump 71 outputs the operating supply voltage VH and, through a voltage limiter 72, the bulk-biasing voltage WB. The charge pump 71 is regulated via a regulator 73, for example including a voltage divider 74 a first intermediate node whereof is connected to a first input of a comparator 75 having a second input connected to a generator 76 of a variable reference voltage VR, in a known way. The voltage divider 74 further defines a pair of second intermediate nodes, connected to the gate terminals of a pair of limitation transistors 77, 78 forming the voltage limiter 72 and connected between the output of the charge pump 71 and ground. In detail, a first limitation transistor 77, of an NMOS type, is connected between the output of the charge pump 71 and the bulk-biasing line 34, and a second limitation transistor 78, of a PMOS type, is connected between the bulk-biasing line 34 and ground.

In practice, the limitation transistors 77, 78 form a source follower, and the voltage divider 74 is sized so as to supply the gate terminal of the first limitation transistor 77 with a voltage equal to WB+Vth (where Vth is the threshold voltage of the transistor 77), chosen such as to obtain the second reference value (e.g., 5 V) for the bulk-biasing voltage WB at the maximum value of the operating supply voltage VH (e.g., 16 V). The second limitation transistor 78 has the purpose of limiting possible overvoltages on the bulk-biasing line 34, due for example to capacitive couplings. To this end, the second limitation transistor 78 receives, on its own gate terminal and when the operating supply voltage has the second operating value, a voltage at a value close to the second reference value.

In this way, the shifter 2 of FIG. 2, which is more compact than the one known of FIG. 1, outputs a high voltage signal, without stressing or causing breakdown of the components at high voltage. In fact, thanks to the biasing of the bulk via a voltage WB higher than zero, the transistors 30-33, 12' and 13' and 8', in three-well configuration, see a gate-to-source drop VGS equal to VH−WB≅10-12 V and can thus be obtained using medium-voltage components and can work safely.

Furthermore, switching-off of the uncoupling transistors 42, 43 guarantees sectioning between the components operating at high voltage and the logic circuitry at low supply voltage (Vdd), and in particular separation of the areas connecting the biasing transistors 12' and 13' and the uncoupling transistors 42, 43 (having a voltage drop WB−Vth) from the logic circuitry.

With the shifter described, in the case of deselection in a modification condition, the output signal OUT is equal to the second reference value of WB, thus approximately 5 V. This, however, is advantageous when the output 9 is connected to wordlines of a memory array, as in the present case, in so far as it contributes to reducing the stresses in the array, since the breakdown voltages of the selection transients and of the byte switches (neither of which are illustrated) are increased for having approximately 5 V on the gate terminals.

Thanks to the reduction of the stress on the transistors connected to the high voltage, it is possible to reach programming/erasing voltages higher than the ones allowed by high voltage transistors, without incurring in problems of breakdown of the junctions.

Finally, it is clear that numerous modifications and variations may be made to the voltage shifter and to the method described and illustrated herein, all of which fall within the scope of the disclosure, as defined in the annexed claims.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage shifter, comprising:
   a latch stage having an input terminal and an output terminal, and configured to receive a supply voltage that varies between a first operating value and a second operating value that is higher than the first operating value;
   an output branch coupled to the output terminal of the latch stage;
   a selection circuit coupled to the input terminal and to the output terminal of the latch stage and configured to receive a selection signal;
   a reference input terminal configured to receive a reference voltage that varies between a first reference value, when the supply voltage has the first operating value, and a second reference value which is higher than the first reference value, when the supply voltage has the second operating value; and
   an uncoupling stage coupled between the input terminal of the latch stage and the selection circuit and having an input terminal configured to receive an uncoupling signal.

2. The voltage shifter of claim 1, wherein the latch stage comprises a first latch transistor and a second latch transistor, each having a first conduction terminal, a second conduction terminal, and a respective control terminal coupled to the first conduction terminal of the second latch transistor and the first conduction terminal of the first latch transistor, respectively, the control terminal of the first latch transistor defining the input terminal of the latch stage, and the control terminal of the second latch transistor defining the output terminal of the latch stage.

3. The voltage shifter of claim 1, comprising an auxiliary stage including a first auxiliary transistor and a second auxiliary transistor that each have a respective first conduction terminal connected to the input terminal and, respectively, to the output terminal of the latch stage, a respective control terminal connected to the output terminal and, respectively, to the input terminal of the latch stage, and a respective second conduction terminal configured to receive the reference voltage.

4. The voltage shifter of claim 3, comprising a mode-switching input terminal configured to receive a switching-on signal, and wherein the auxiliary stage further includes a first switching transistor and a second switching transistor coupled to the second conduction terminals of the first auxiliary transistor and of the second auxiliary transistor, respectively, the first and second switching transistors having respective control terminals coupled together and to the mode-switching input terminal to receive the switching-on signal.

5. The voltage shifter of claim 4, wherein the auxiliary transistors and the switching transistors are MOS transistors having bulk terminals configured to receive the reference voltage.

6. The voltage shifter of claim 1, wherein the output branch includes a first and a second output transistor, the first output transistor having a bulk terminal configured to receive the supply voltage and the second output transistor having a bulk terminal configured to receive the reference voltage.

7. The voltage shifter of claim 1, comprising a mode-switching stage, and wherein the selection circuit has an input terminal and an output terminal, and the uncoupling stage includes a first and a second uncoupling transistor coupled to the input terminal and the output terminal, respectively, of the latch stage and further coupled to the input terminal and the output terminal, respectively, of the selection circuit, the uncoupling transistors having respective control terminals connected together and to the mode-switching stage that is configured to switch off the uncoupling transistors.

8. The voltage shifter of claim 7, further comprising an intermediate biasing stage having an intermediate biasing input terminal, including a first biasing transistor and a second biasing transistor coupled between the input terminal and the output terminal, respectively, of the latch stage and to the first and the second uncoupling transistor, respectively, the first and second biasing transistors being of a MOS type with respective bulk terminals configured to receive the reference voltage and having respective control terminals coupled together and to the intermediate biasing input terminal.

9. The voltage shifter of claim 7, wherein the mode-switching stage includes an inverter having a supply input terminal configured to receive the supply voltage.

10. The voltage shifter of claim 1, comprising a voltage source configured to generate the supply voltage and a voltage limiter coupled to the voltage generator and configured to generate the reference voltage.

11. The voltage shifter of claim 4, wherein the auxiliary transistors, the switching transistors, the second output transistor, and the biasing transistors are medium-voltage transistors configured to have a breakdown voltage of less than 13 V in a three-well configuration.

12. A nonvolatile memory, comprising:

a charge pump; and a memory array including a plurality of rows and a plurality of voltage shifters, each voltage shifter coupled between the charge pump and a respective row, each voltage shifter including:

a latch stage having a first input terminal and an output terminal and configured to receive a supply line supplying a supply voltage that varies between a first operating value and a second operating value that is higher than the first operating value;

an output branch coupled to the output terminal of the latch stage;

a selection circuit coupled to the input terminal and to the output terminal of the latch stage and configured to receive a selection signal;

a reference input terminal configured to receive a reference voltage that varies between a first reference value, when the supply voltage has the first operating value, and a second reference value, higher than the first reference value, when the supply voltage has the second operating value; and an uncoupling stage coupled between the input terminal of the latch stage and the selection circuit and having a uncoupling input terminal configured to receive an uncoupling signal.

13. The memory of claim 12, wherein the latch stage includes a first latch transistor and a second latch transistor that each have first and second conduction terminals, and each having respective control terminals coupled to the first conduction terminal of the second latch transistor and of the first latch transistor, respectively, the control terminal of the first latch transistor defining the input terminal of the latch stage, and the control terminal of the second latch transistor defining the output terminal of the latch stage.

14. The memory of claim 12, comprising an auxiliary stage including a first auxiliary transistor and a second auxiliary transistor that each have a respective first conduction terminal connected to the input terminal and, respectively, to the output terminal of the latch stage, a respective control terminal connected to the output terminal and, respectively, to the input terminal of the latch stage, and a respective second conduction terminal configured to receive the reference voltage.

15. The memory of claim 14, comprising a mode-switching input terminal configured to receive a switching-on signal, and wherein the auxiliary stage further comprises a first switching transistor and a second switching transistor coupled to the respective second conduction terminals of the first auxiliary transistor and of the second auxiliary transistor, respectively, the first and second switching transistors each having respective control terminals connected together and to the mode-switching input terminal to receive the switching-on signal.

16. A device, comprising:

a supply line configured to supply a supply voltage that varies between a first operating value and a second operating value that is higher than the first operating value;

a reference potential line configured to supply a reference voltage that varies between a first reference value and a second reference value higher than the first reference value when the supply voltage has the second operating value; and a voltage shifter that includes:

a latch stage coupled to the supply line and a reference potential line and having a first input and an output;

an output branch coupled to the supply line and the reference potential line and coupled to the output terminal of the latch stage;

a selection circuit configured to receive a selection signal and connected to the input terminal and to the output terminal of the latch stage;

a reference input terminal coupled to the reference potential line and configured to receive the reference voltage; and an uncoupling stage coupled to the input terminal of the latch stage and the selection circuit and having a uncoupling input terminal configured to receive an uncoupling signal.

17. The device of claim 16, comprising an auxiliary stage including a first auxiliary transistor and a second auxiliary transistor that each have a respective first conduction terminal connected to the input terminal and, respectively, to the output terminal of the latch stage, a respective control terminal connected to the output terminal and, respectively, to the input terminal of the latch stage, and a respective second conduction terminal connected to the reference potential line.

18. The device of claim 17, comprising a mode-switching input terminal configured to receive a switching-on signal, and wherein the auxiliary stage further includes a first switching transistor and a second switching transistor coupled to the respective second conduction terminals of the first auxiliary transistor and of the second auxiliary transistor, respectively, and to the reference potential line, the first and second switching transistors each having respective control terminals coupled together and to the mode-switching input terminal, the mode-switching input terminal configured to receive the switching-on signal.

19. The device of claim 16 comprising a mode-switching stage, and wherein the uncoupling stage includes a first and a second uncoupling transistor coupled to the input terminal, and the output terminal, respectively, of the latch stage and to the selection circuit, the uncoupling transistors each having respective control terminals coupled together and to the mode-switching stage that is configured to switch off the first and second uncoupling transistors.

20. The device of claim 19, further comprising an intermediate biasing stage having an intermediate biasing terminal and including a first biasing transistor and a second biasing transistor coupled to the input and the output terminals, respectively, of the latch stage and to the first and the second uncoupling transistors, respectively, the first and second biasing transistors being of a MOS type with respective bulk terminals coupled to the reference potential line and having respective control terminals coupled together and to the intermediate biasing terminal.

21. The device of claim 19, wherein the mode-switching stage includes an inverter having a supply input terminal coupled to the supply line.

* * * * *